United States Patent
Xin-LeBlanc

(10) Patent No.: US 6,646,477 B1
(45) Date of Patent: Nov. 11, 2003

(54) PHASE FREQUENCY DETECTOR WITH INCREASED PHASE ERROR GAIN

(75) Inventor: Jane Xin-LeBlanc, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/084,537

(22) Filed: Feb. 27, 2002

(51) Int. Cl.[7] .......................... G01R 25/00; H03D 13/00
(52) U.S. Cl. .................................. 327/3; 327/12
(58) Field of Search .............................. 327/2, 3, 5, 7, 327/8, 12; 331/11, 12, 25

(56) References Cited

U.S. PATENT DOCUMENTS

| | | | | |
|---|---|---|---|---|
| 3,571,743 A | * | 3/1971 | Menkes | 331/11 |
| 4,020,422 A | * | 4/1977 | Underhill | 327/12 |
| 5,315,269 A | * | 5/1994 | Fujii | 331/1 A |
| 5,550,515 A | * | 8/1996 | Liang et al. | 331/11 |
| 5,764,709 A | * | 6/1998 | Whiteside | 375/375 |
| 6,147,561 A | * | 11/2000 | Rhee et al. | 331/12 |
| 6,218,868 B1 | * | 4/2001 | Katoh | 327/12 |

OTHER PUBLICATIONS

Roland E. Best, "Phase Locked Loops", 1997, pps. 91–102, 3rd ed., McGraw–Hill, United States.

* cited by examiner

Primary Examiner—Tuan T. Lam
(74) Attorney, Agent, or Firm—Vedder, Price, Kaufman & Kammholz, P.C.

(57) ABSTRACT

A phase-frequency detector (PFD) with increased phase error gain during acquisition of phase lock when used in a phase-locked loop (PLL). The reference and feedback signals are time-multiplexed into N pairs of input signals. Each pair of input signals is detected by one of N phase-frequency detectors, which produce N pairs of detection signals indicative of phase differences between the reference and feedback signals. These N pairs of detection signals are combined in separate logical-OR operations to produce a frequency increase control signal and a frequency decrease control signal indicative of when the feedback signal frequency is lower and higher, respectively, than the reference signal frequency. These control signals have respective substantially nonzero signal values that vary in respective relations to the difference between the reference and feedback signal phases when such phase difference is less than $2\pi$ radians, and repeat with patterns having phase difference intervals of $2N\pi$ radians when such phase difference is greater than $2\pi$ radians.

18 Claims, 9 Drawing Sheets

PHASE FREQUENCY DETECTOR WITH INCREASED PHASE ERROR GAIN

BACKGROUND OF THE INVENTION

1. Field of the Invention

The present invention relates to digital phase-locked loops (PLLs), and in particular, to phase-frequency detectors (PFDs) used in such digital PLLs.

2. Description of the Related Art

Referring to FIG. 1, a conventional PFD that has been used in many digital PLL designs includes two D-type flip-flops 12u, 12d and a logic AND gate 14. The flip-flops 12u, 12d are separately clocked by the reference signal REF and feedback signal FB. With each rising edge of these input signals REF, FB, a logic one (VDD applied at the D-input) is clocked through to the output Q of each flip-flop 12u, 12d. The data output signals Q of the flip-flops 12u, 12d form the "pump up". UP and "pump down" DN signals used for controlling a charge pump circuit 20. Whenever the reference signal REF leads the feedback signal FB in phase, the pump up signal UP is asserted. Conversely, when the feedback signal FB leads the reference signal REF in phase, the pump down signal DN is asserted. When the pump up signal UP is asserted (and inverted by the inverter 18 within the charge pump 20), the output pull-up transistor P1 is turned on, thereby causing electrical charge to be pumped to the output terminal 21. Conversely, when the pump down signal DN is asserted, the output pull-down transistor N1 is turned on, thereby causing electrical charge to be sunk from the output terminal 21.

The logic AND gate 14 ensures that the data output signals Q of the flip-flops 12u, 12d are cleared in the event that both the pump up signal UP and pump down signal DN become asserted simultaneously.

A logic OR gate 16 can be included, as shown, so as to enable the user to place the PFD 10 in a high impedance state. By asserting the control signal HiZ, the output 17 of the logic OR gate 16 is also asserted, thereby clearing both output signals Q of the flip-flops 12u, 12d. With both of these signals UP, DN in their cleared, or unasserted, states, both output transistors P1, N1 of the charge pump are turned off, thereby leaving the output terminal 21 of the charge pump 20 in a high impedance state.

This type of PFD 10 is widely used due to the advantages afforded by its transfer function. As is well known, this type of PFD 10 has a transfer function such that the output signal 23 of the charge pump 20, due to the control signals UP, DN provided by the PFD 10, depends upon the phase difference between the two input signals REF, FB when the host PLL is in its phase-locked state, and depends upon the frequency difference between the input signals REF, FB when the host PLL is in its unlocked state. Accordingly, a digital PLL in which this PFD 10 is used will lock under any condition, in terms of the input signals REF, FB, regardless of the type of loop filter in use.

Referring to FIG. 2, by way of example, the timing diagrams are shown for the input REF, FB and output UP, DN signals when the host PLL (not shown) is not phase-locked, in this case with the feedback signal FB being slightly lower in frequency than the reference signal REF. Since the feedback signal FB lags the reference signal REF, the net output of the PFD 10 is "up," i.e., the pump up signal UP is asserted, thereby seeking to increase the output frequency of the host PLL and, therefore, increase the frequency of the feedback signal FB. Accordingly, the duty cycle of this PFD output UP gradually increases until the point in time when the feedback signal FB lags the reference signal REF by approximately 360°, or $2\pi$ radians, in phase (at approximately the 300 nanosecond point in time for this example). At this point in time, the duty cycle of the PFD output UP changes from being nearly 100% to 0%.

Referring to FIG. 3, most loop filters 22 have low pass frequency characteristics and typically consist of a serially-connected resistor R and capacitor C1 connected in shunt with another capacitor C2, as shown. When the duty cycle of the PFD output signal UP is high, and particularly as it is increasing, the voltage 23 across the loop filter 22 rises. Hence, this loop filter voltage 23 is higher at the end of each successive charge pump update. However, when the duty cycle is low, and particularly as it is decreasing, this loop filter voltage 23 decreases even though the net charge being delivered to the loop filter 22 by the positive pulses of the PFD signal UP continues to be positive. This is due to the fact that most loop filters 22 use second order loop filters, such as that shown here, where the series capacitors C1 has a larger capacitance value than the shunt capacitor C2. As a result, before the loop filter 22 achieves its final state of equilibrium, the voltage on the smaller capacitor C2 is higher than the voltage across the larger capacitor C1. Hence, if the duty cycle of the PFD output signal UP (or DN) is not high enough, the net change of the loop filter output voltage 23 can be negative.

SUMMARY OF THE INVENTION

A phase-frequency detector (PFD) in accordance with the presently claimed invention has increased phase error gain during acquisition of phase lock when used in a phase-locked loop (PLL). The reference and feedback signals are time-multiplexed into N pairs of input signals. Each pair of input signals is detected by one of N phase-frequency detectors, which produce N pairs of detection signals indicative of phase differences between the reference and feedback signals. These N pairs of detection signals are combined to produce frequency increase and decrease control signals indicative of when the feedback signal frequency is lower and higher, respectively, than the reference signal frequency. These control signals have respective substantially nonzero signal values that vary in respective relations to the difference between the reference and feedback signal phases when such phase difference is less than $2\pi$ radians, and repeat with patterns having phase difference intervals of $2N\pi$ radians when such phase difference is greater than $2\pi$ radians.

In accordance with one embodiment of the presently claimed invention, a PFD having increased phase error gain during acquisition of phase lock when used in a PLL includes routing circuitry, phase-frequency detection circuitry and combining circuitry. The routing circuitry receives and selectively routes reference and feedback signals having respective signal frequencies and phases to provide respective pluralities of reference and feedback signals. The phase-frequency detection circuitry, coupled to the routing circuitry, receives and detects the pluralities of reference and feedback signals to provide a plurality of detection signals having respective substantially nonzero signal values that vary in respective relations to: a difference between the reference and feedback signal phases when the signal phase difference is less than $2\pi$ radians; and a difference between the reference and feedback signal frequencies when the signal phase difference is greater than $2\pi$ radians. The combining circuitry, coupled to the phase-frequency detection circuitry, combines the plurality of detection signals to provide: a frequency increase control signal indicative of when the feedback signal frequency is lower than the reference signal frequency; and a frequency decrease control signal indicative of when the feedback signal frequency is higher than the reference signal frequency.

In accordance with another embodiment of the presently claimed invention, a PFD having increased phase error gain during acquisition of phase lock when used in a PLL includes input circuitry, output circuitry and a plurality N of phase-frequency detection circuits. The input circuitry receives reference and feedback signals having respective signal frequencies and phases and in response thereto provides a plurality of input signals. The output circuitry receives a plurality of output signals and in response thereto provides first and second control signals indicative of when the feedback signal frequency is lower and higher, respectively, than the reference signal frequency. The plurality N of phase-frequency detection circuits, coupled between the input and output circuitry, processes the plurality of input signals to provide the plurality of output signals. The first and second control signals have respective substantially nonzero signal values that: vary in respective relations to a difference between the reference and feedback signal phases when the signal phase difference is less than $2\pi$ radians; and repeat with patterns having phase difference intervals of $2N\pi$ radians when the signal phase difference is greater than $2\pi$ radians.

In accordance with still another embodiment of the presently claimed invention, a PFD having increased phase error gain during acquisition of phase lock when used in a PLL includes router means, phase-frequency detector means and combiner means. The router means is for receiving and selectively routing reference and feedback signals having respective signal frequencies and phases and providing respective pluralities of reference and feedback signals. The phase-frequency detector means is for receiving and detecting the pluralities of reference and feedback signals and providing a plurality of detection signals having respective substantially nonzero signal values that vary in respective relations to: a difference between the reference and feedback signal phases when the signal phase difference is less than $2\pi$ radians; and a difference between the reference and feedback signal frequencies when the signal phase difference is greater than $2\pi$ radians. The combiner means is for combining the plurality of detection signals and providing: a frequency increase control signal indicative of when the feedback signal frequency is lower than the reference signal frequency; and a frequency decrease control signal indicative of when the feedback signal frequency is higher than the reference signal frequency.

In accordance with yet another embodiment of the presently claimed invention, a PFD having increased phase error gain during acquisition of phase lock when used in a PLL includes input means, output means and phase-frequency detector means. The input means is for receiving reference and feedback signals having respective signal frequencies and phases and in response thereto providing a plurality 2N of input signals. The output means is for receiving a plurality 2N of output signals and in response thereto providing first and second control signals indicative of when the feedback signal frequency is lower and higher, respectively, than the reference signal frequency. The phase-frequency detector means is for processing the plurality 2N of input signals and providing the plurality 2N of output signals. The first and second control signals have respective substantially nonzero signal values that: vary in respective relations to a difference between the reference and feedback signal phases when the signal phase difference is less than $2\pi$ radians; and repeat with patterns having phase difference intervals of $2N\pi$ radians when the signal phase difference is greater than $2\pi$ radians.

DETAILED DESCRIPTION OF THE INVENTION

Figure 1:
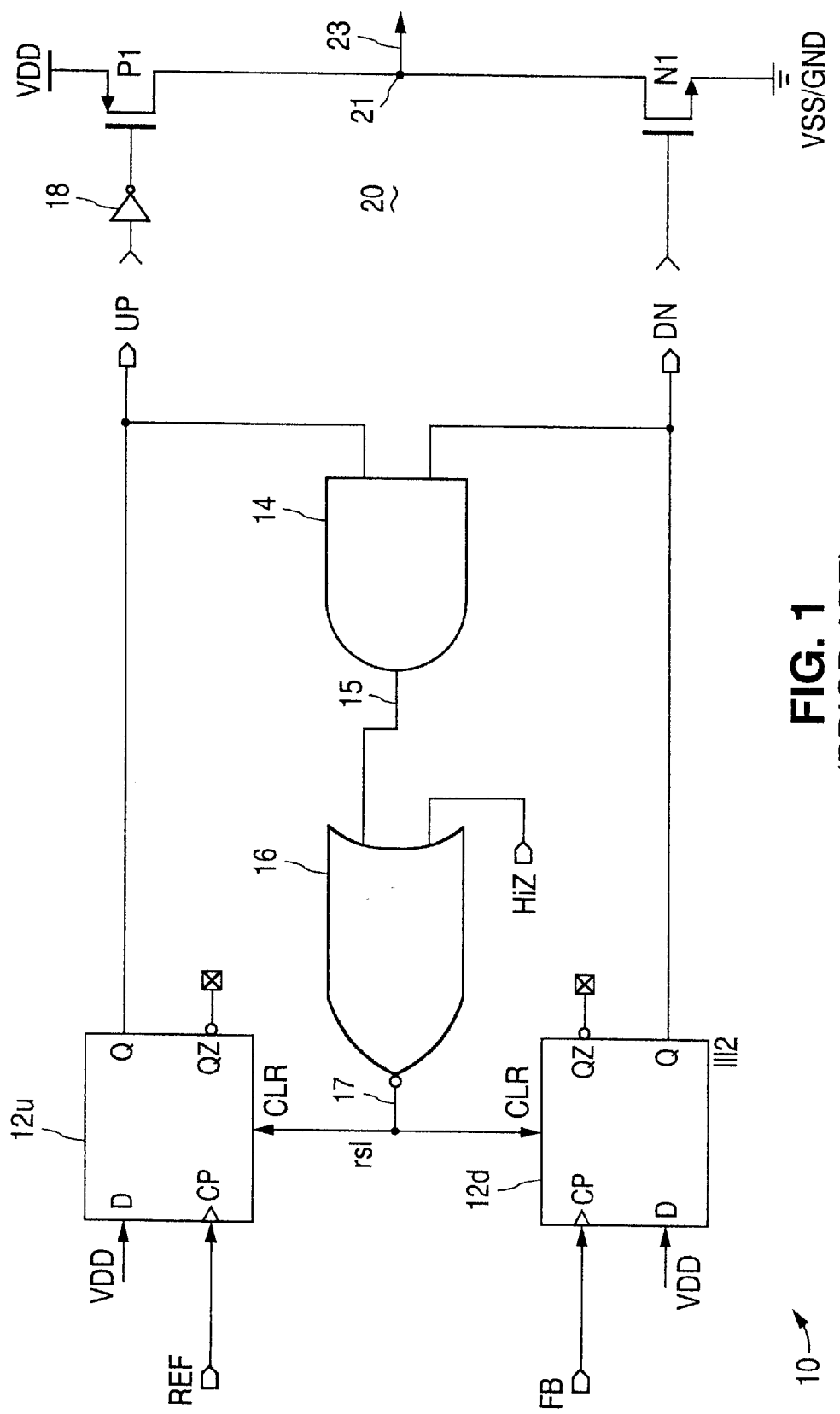
FIG. 1 is a schematic diagram of a conventional PFD circuit and associated charge pump circuit.
Figure 4:
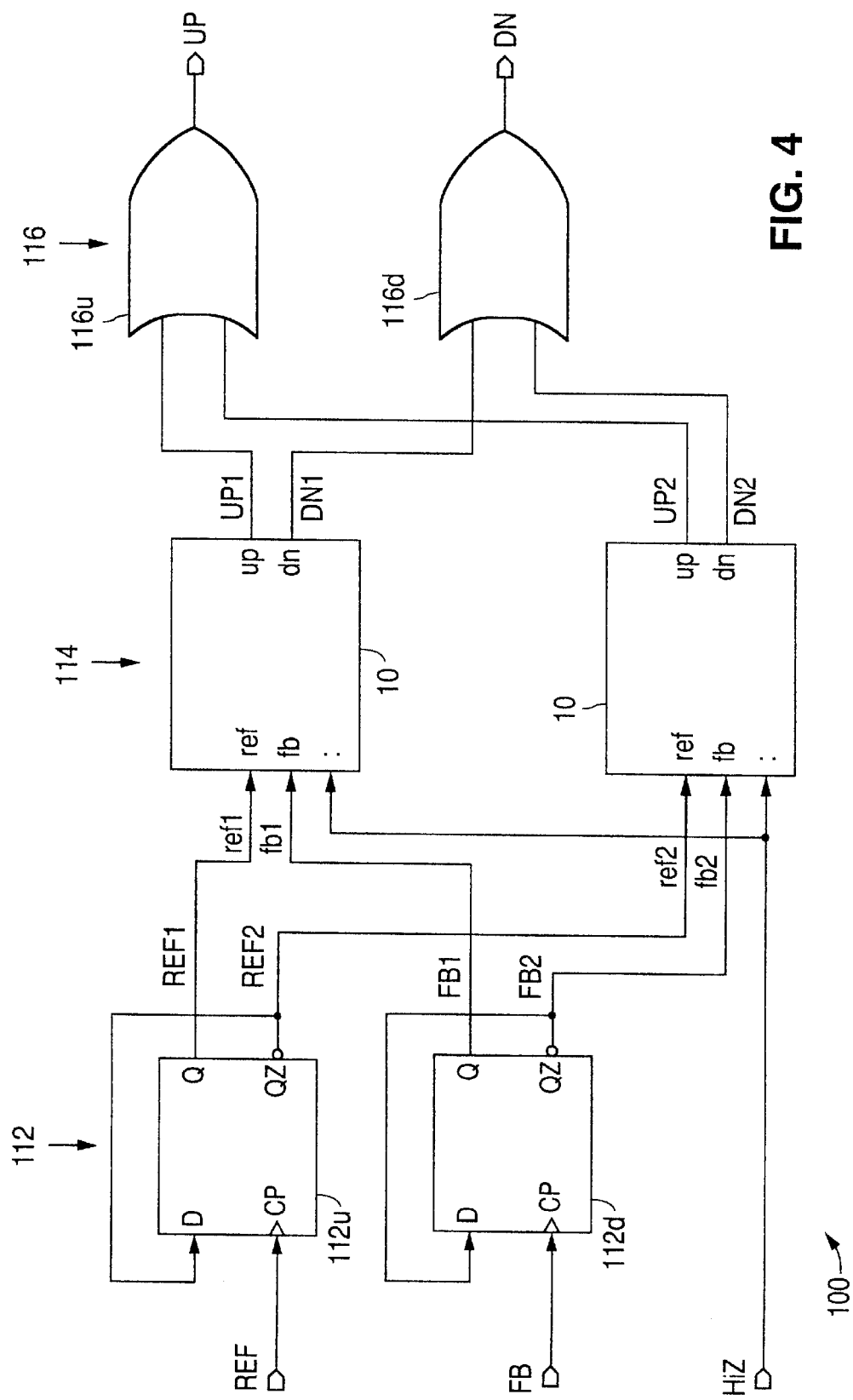
FIG. 4 is a schematic diagram of a PFD circuit in accordance with one embodiment of the presently claimed invention.

Referring to FIG. 4, a PFD circuit 100 in accordance with one embodiment of the presently claimed invention has an input stage 112, a PFD stage 114 and an output stage 116. The PFD stage 114 uses conventional PFD circuits 10 (FIG. 1). The output signals UP1, DN1, UP2, DN2 of the respective PFD circuits 10 are combined in the logic OR gates 116u, 116d to produce the overall, or composite, output control signals UP, DN.

At the input, the reference REF and feedback FB signals are time-multiplexed to provide the respective reference REF1, REF2 and feedback FB1, FB2 signals to the PFD circuits 10. In this particular embodiment, where two PFD circuits 10 are used, this multiplexing function can be performed using two D-type flip-flops 112u, 112d, connected as shown. Each flip-flop 112u, 112d is connected in the well known toggle configuration in which the inverted output QZ is fed back to the D-input.

The PFD circuits 10 are conventional in design and process their respective input signals REF1, FB1, REF2, FB2 to provide their respective output signals UP1, DN1, UP2, DN2 in accordance with the discussion above concerning the circuit 10 of FIG. 1.

Figure 2:
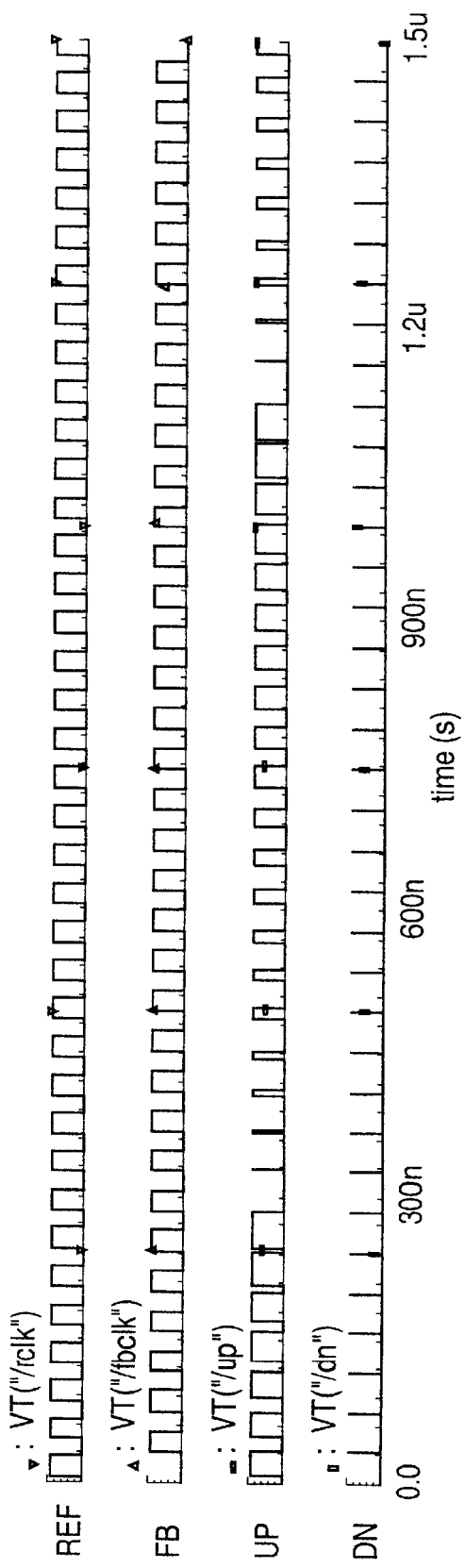
FIG. 2 is a signal-timing diagram for the signals of the circuit of FIG. 1.
Figure 5:
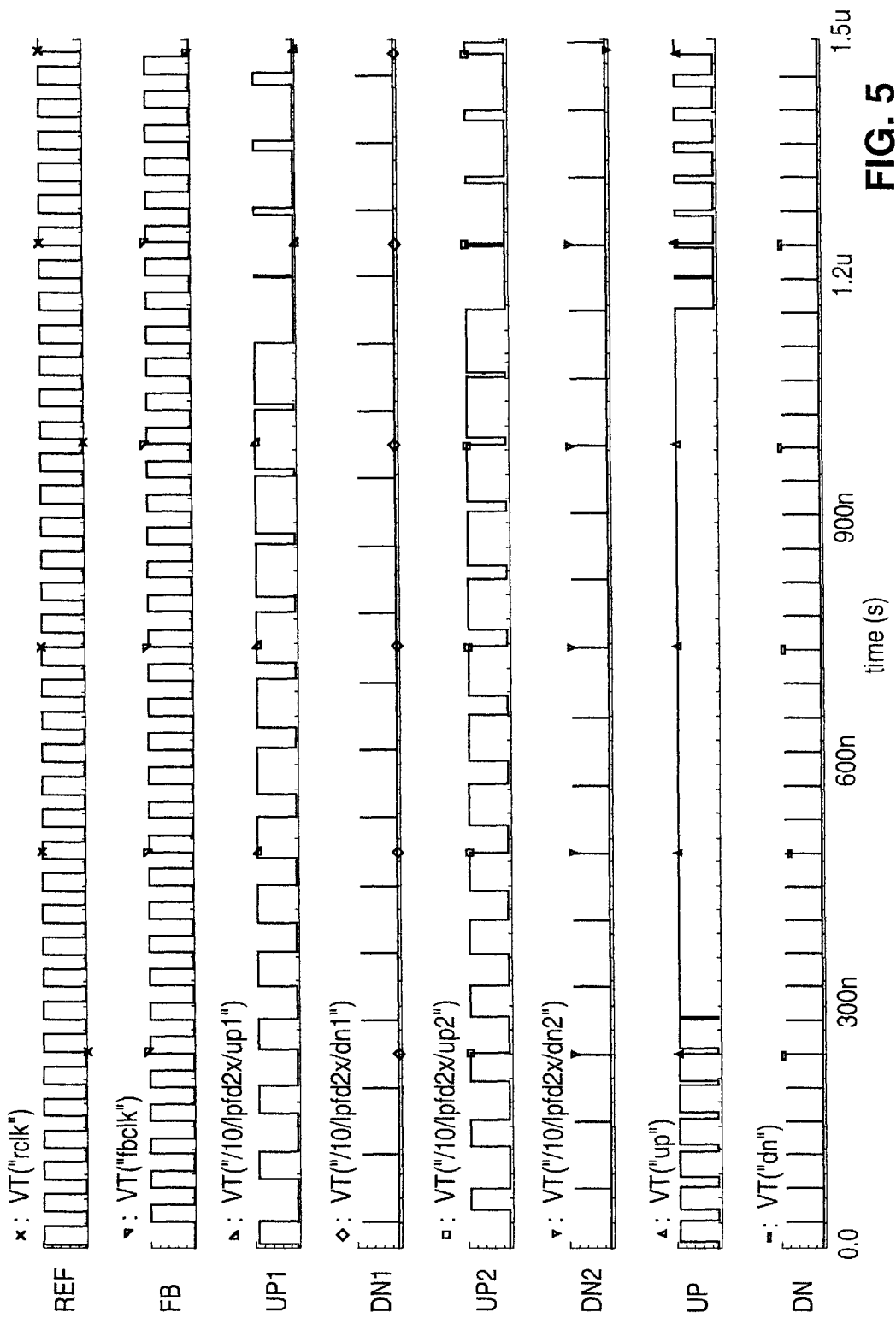
FIG. 5 is a signal-timing diagram for the signals of the circuit of FIG. 4.

Referring to FIG. 5, by way of an example, the operation of this circuit 100 when the frequency of the feedback signal FB is lower than the frequency of the reference signal REF is as follows. As is shown, as the signal waveforms progress over time, the lower frequency feedback signal FB increasingly lags in phase relative to the higher frequency reference signal REF. As can be seen by the resulting output signals UP1, DN1, UP2, DN2 from the respective PFD circuits 10, the duty cycles of the asserted internal control signals UP1, UP2 do not wrap, or revert to their unasserted states, when the phase difference reaches $2\pi$ radians. Instead, the duty cycles remain close to 100% for the interval of time that the phase error is between $2\pi$ and $4\pi$ radians. Accordingly, these control signals UP1, UP2 have higher average duty cycles (over multiples of $2\pi$ radians of phase) as compared to the corresponding output signal UP (FIG. 2) of the conventional PFD circuit 10 (FIG. 1).

By combining these signals UP1, UP2, with their higher duty cycles, in the output stage 116, an overall, or composite, output control signal UP is obtained in which the duty cycle is, in fact, 100% during this time interval. (As should be understood, when the frequency of the feedback signal FB is, conversely, higher than the frequency of the reference signal REF, the foregoing discussion remains true, but with the pump up UP and pump down DN signals interchanged.)

Figure 3:
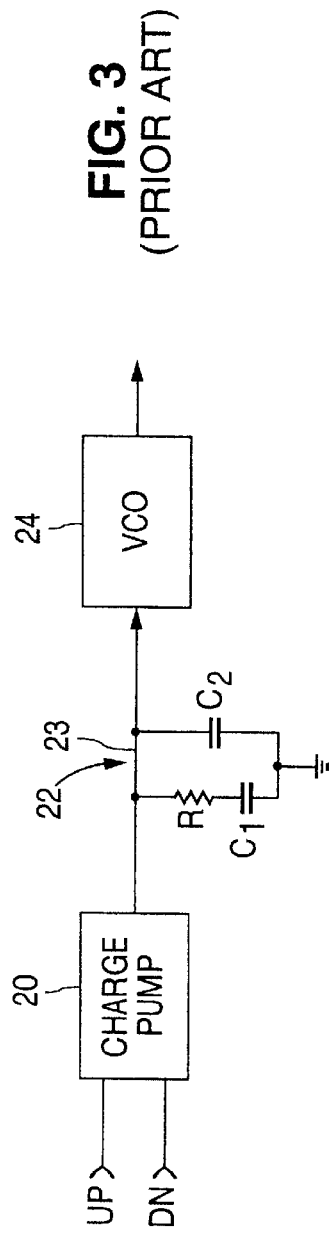
FIG. 3 is a functional block and schematic diagram of a conventional charge pump circuit, loop filter circuit and voltage-controlled oscillator used in a PLL.
Figure 6A:
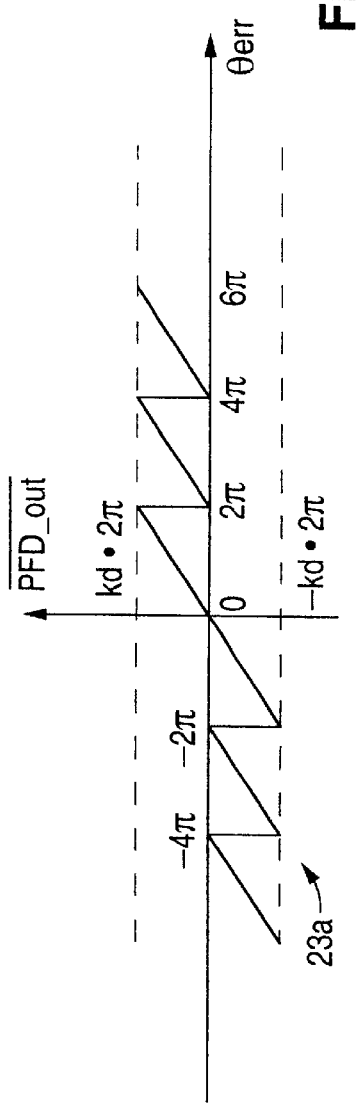
FIG. 6A is a graph of the transfer function for the circuit of FIG. 1.
Figure 6B:
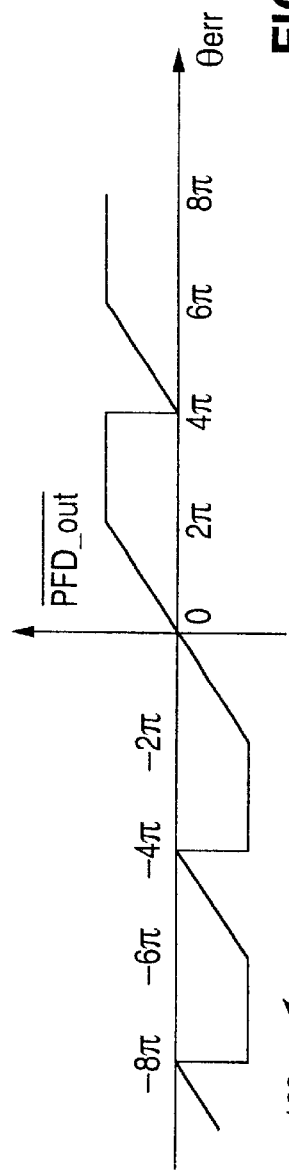
FIG. 6B is a graph of the transfer function for the circuit of FIG. 4.

Referring to FIGS. 6A and 6B together, a difference in the performance of the PFD circuit of FIG. 4 as compared to that of the PFD circuit of FIG. 1 can be visualized by plotting the average PFD output signal/PFD_output/verses the input phase error $\theta$err, i.e., the phase difference between the input signals REF, FB. As shown in FIG. 6A for the circuit of FIG. 1, the average PFD output signal value/PFD_output/, e.g., the signal 23a across the loop filter 22.(FIG. 3), is proportional to the phase error $\theta$err when such phase error $\theta$err is less than $2\pi$ radians, i.e., between $-2\pi$ (lag) and $+2\pi$ (lead) radians. When the phase error $\theta$err becomes greater than $2\pi$ radians, the output signal/PFD_output/begins to wrap and becomes proportional to the phase error $\theta$err in a pattern that repeats every $2\pi$ radians. (It will be appreciated that this same characteristic is demonstrated by the average of the actual pump up UP and pump down DN control signals generated by the PFD circuit.)

Referring to FIG. 6B, the characteristic plot for the average PFD output signal/PFD_output/versus phase error $\theta$err for the circuit of FIG. 4 demonstrates the same transfer function when the phase error $\theta$err is less than $2\pi$ radians, i.e., that of proportionality. Hence, the PFD circuit of FIG. 4 performs as a conventional PFD circuit (FIG. 1) when the host PLL is in the last stages of phase lock or is already phase-locked ($-2\pi<\theta$err$<+2\pi$). However, when the phase error $\theta$err becomes greater than $2\pi$ radians, but is less than $4\pi$ radians, the average PFD output signal/PFD_output/ remains at its maximum value, and remains at this maximum value until the phase error $\theta$err reaches $4\pi$ radians. At that point, the transfer function begins to wrap, and begins to repeat in a pattern extending over $4\pi$ radians of phase error $\theta$err.

Figure 7:
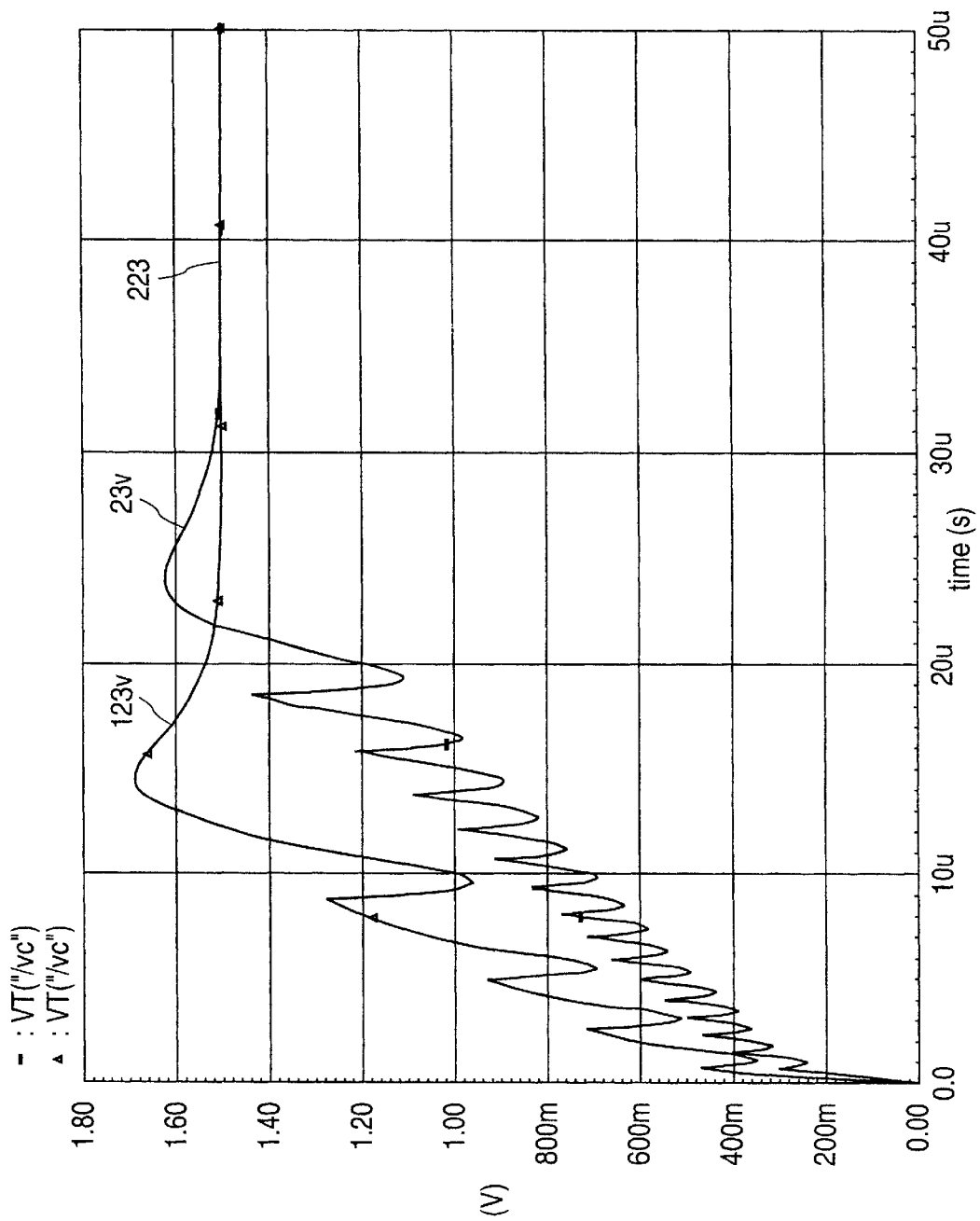
FIG. 7 is a graph comparing the loop filter output voltages over time for the circuits of FIGS. 1 and 4 when used in a PLL.

Referring to FIG. 7, the effect of this difference in transfer functions can also be visualized by plotting the filtered PFD output signal 23 v/123 v across the loop filter 22 (FIG. 3) which serves as the control voltage for the voltage-controlled oscillator (VCO) 24 used by the host PLL. For the conventional circuit 10 of FIG. 1, this control voltage 23 v transcends many minimum and maximum peak values prior to reaching its steady state value 223 following acquisition of phase lock. In contrast, the control voltage 123 v produced by filtering the improved output signals from the PFD circuit 100 of FIG. 4 experiences far fewer interim signal peaks and achieves the steady state value 223 sooner since the host PLL achieves phase lock more rapidly.

Figure 8:
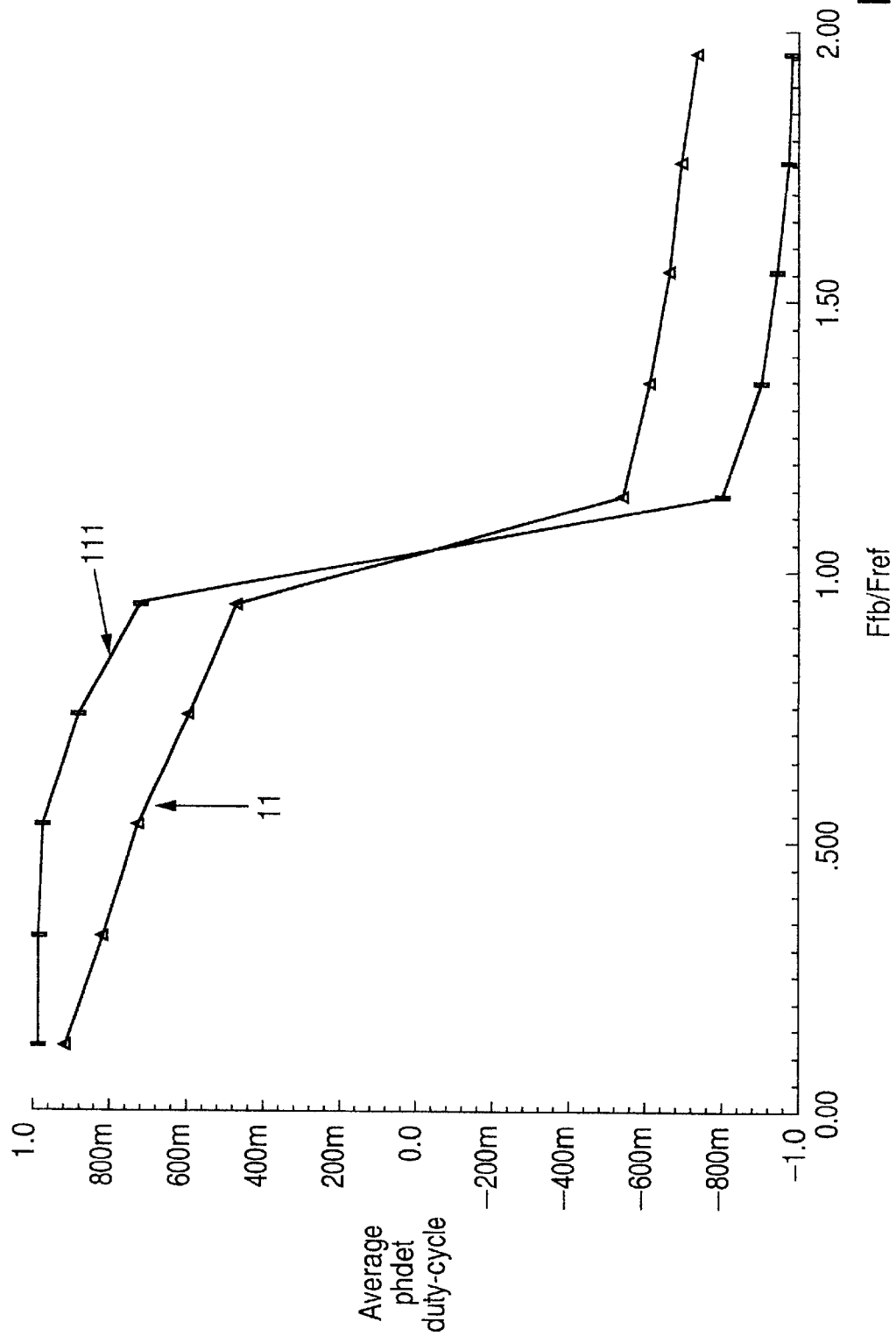
FIG. 8 is a graph comparing the average duty cycles for the output signals of the circuits of FIGS. 1 and 4.

Referring to FIG. 8, this difference in transfer functions can be visualized in yet another way by plotting the average duty cycle of the PFD output signals UP, DN versus the input frequency ratio Ffb/Fref, i.e., the ratio of the feedback signal frequency Ffb to the reference signal frequency Fref. As for the examples discussed above for the circuits of FIGS. 1 and 4, when the feedback signal frequency Ffb is lower than the reference signal frequency Fref, this ration is less than unity, and the pump up control signal UP has a high duty cycle. As shown by plot 11 for the circuit of FIG. 1 and plot 111 for the circuit of FIG. 4, the corresponding duty cycle for the output control signal for the circuit of FIG. 4 remains significantly higher for a longer interval than the control signal for the circuit of FIG. 1, thereby demonstrating a significantly higher phase error gain. Due to this higher average duty cycle for a given input frequency difference, the PFD circuit 100 of FIG. 4 can charge the loop filter faster, and thereby produce a faster PLL frequency lock time.

Figure 9:
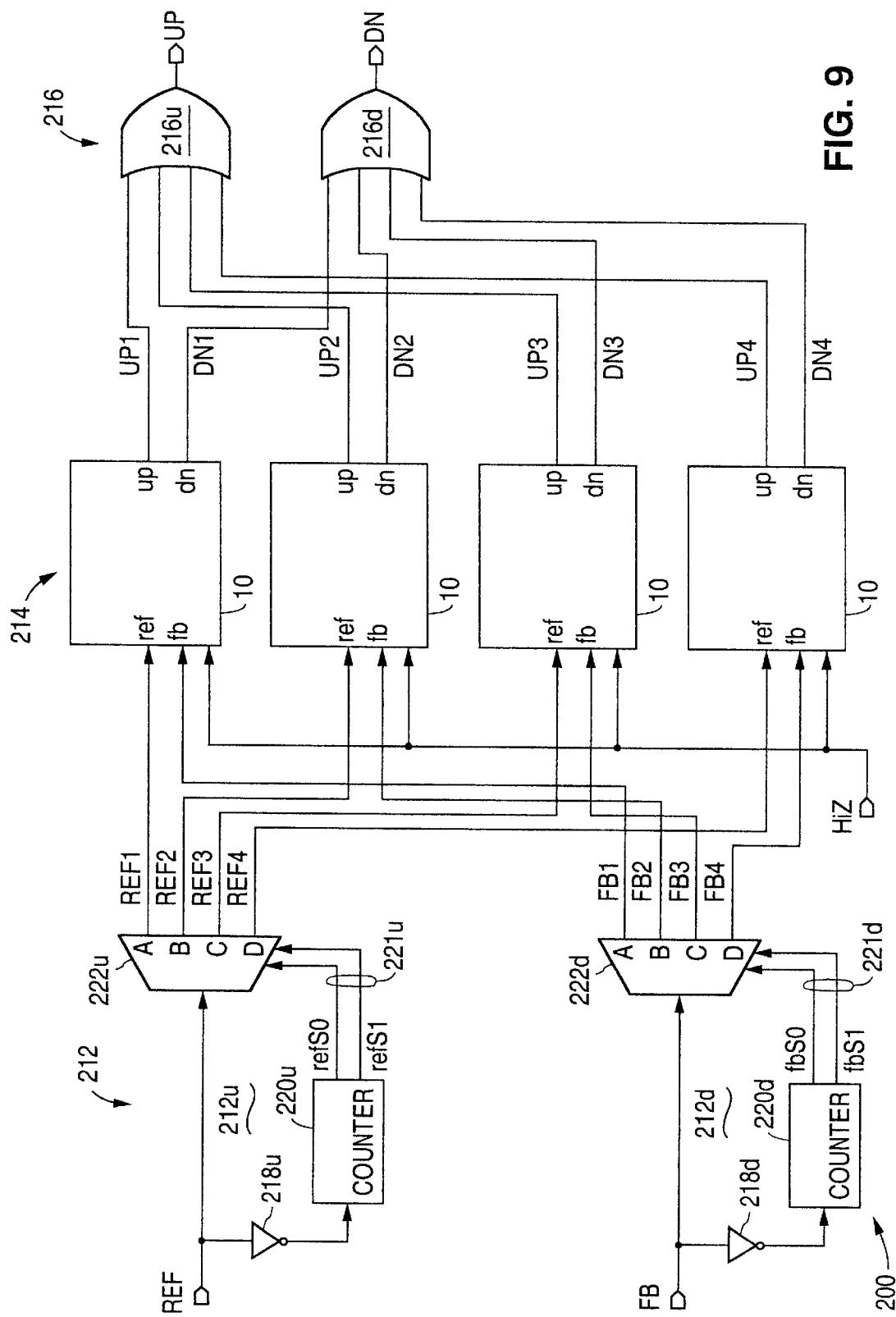
FIG. 9 is a schematic diagram of a PFD circuit in accordance with another embodiment of the presently claimed invention.

Referring to FIG. 9, in accordance with the present invention, the PFD circuit 100 of FIG. 4 can be expanded to a PFD circuit 200 in which the PFD stage 214 uses 4 conventional PFD circuits 10. The input stage 212 performs the multiplexing of the input reference REF and feedback FB signals, while the output stage 216 continues to provide the logical OR operations for combining the respective pump up UP1, UP2, UP3, UP4 and pump down DN1, DN2, DN3, DN4 signals.

The input signals REF, FB are multiplexed using counters 220 and multiplexor circuits 222. The inverters 218 are used so as to cause the counters 220 to increment on the falling, or trailing, edges of the incoming clock signals REF, FB. (This prevents timing problems cause by not allowing for sufficient setup time for the input signals REF, FB presented to the inputs of the multiplexors 222u, 222d.) The output signals 221 of the counters 220 serve as the control signals for the multiplexors for selecting the appropriate output signal REF1, REF2, REF3, REF4, FB1, FB2, FB3, FB4 to be active and provided to the corresponding PFD circuit 10. Upon reaching their terminal counts, these counters 220 reset to zero and begin incrementing once again.

Figure 10:
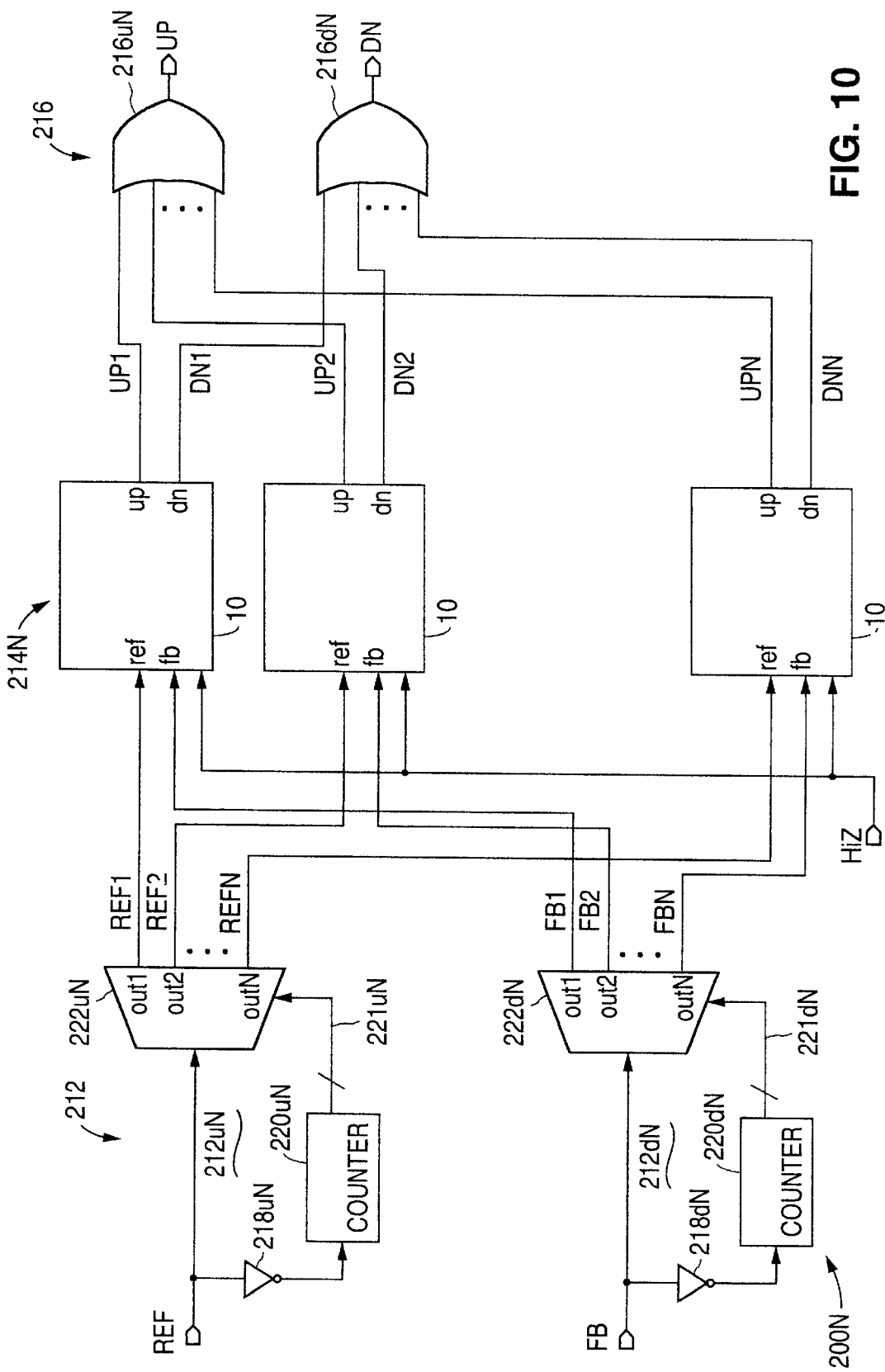
FIG. 10 is a schematic diagram of a PFD circuit in accordance with still another embodiment of the presently claimed invention.

Referring to FIG. 10, the PFD circuits 100, 200 of FIGS. 4 and 9 can be further expanded to a PFD circuit 200N in which N conventional PFD circuits 10 are used. The operation of this circuit 200N is the same as the circuit 200 of FIG. 9 when N equals four. When N is greater than four: the counters 220 count to the higher number N−1 (0, 1, . . . , N−1); there are more ($\log_2$N) counter output signals 221; there are N multiplexed reference signals REF1, REF2, . . . , REFN; there are N feedback signals FB1, FB2, . . . , FBN; there are N PFD pump up output signals UP1, UP2, UPN; and there are N PFD pump down output signals DN1, DN2, . . . , DNN.

Figure 11:
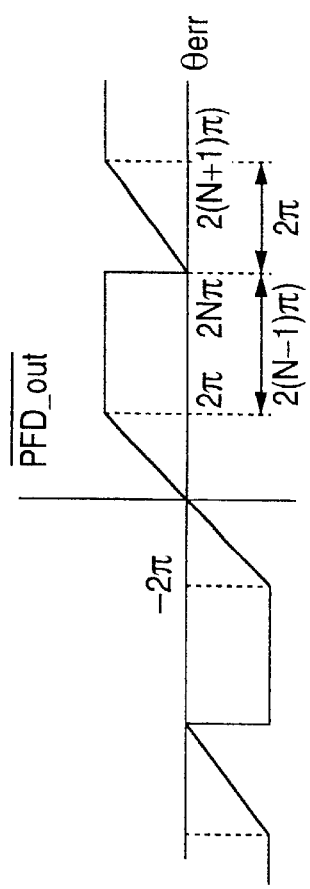
FIG. 11 is a graph of the generalized transfer function for the circuits of FIG. 4, 9 and 10.

Referring to FIG. 11, and with reference to FIGS. 6A and 6B, the transfer function for the circuits of FIGS. 4, 9 and 10 can be generalized as shown. During the interval in which the phase error $\theta$err is less than $2\pi$ radians, the average PFD output signal/PFD_output/is proportional to such phase error $\theta$err. So long as the phase error $\theta$err is greater than $2\pi$ radians, and less than $2N\pi$ radians, the average PFD output signal/PFD_output/remains at its maximum. This signal reverts to zero at a phase error $\theta$err of $2N\pi$ radians, following which it again becomes proportional to the phase error $\theta$err for the next $2\pi$ radians of phase error $\theta$err. This pattern then repeats for successive phase difference intervals of $2N\pi$ radians.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a phase-frequency detector (PFD) having increased phase error gain during acquisition of phase lock when used in a phase-locked loop (PLL), comprising:
   routing circuitry that receives and selectively routes reference and feedback signals having respective signal frequencies and phases to provide respective pluralities of corresponding routed reference and feedback signals with substantially mutually exclusive signal assertion states;
   phase-frequency detection circuitry, coupled to said routing circuitry, that receives and detects said pluralities of reference and feedback signals to provide a plurality 2N of detection signals having respective substantially nonzero signal values that vary in respective relations to
      a difference between said reference and feedback signal phases
      when said signal phase difference is less than $2\pi$ radians, and a difference between said reference and feedback signal frequencies when said signal phase difference is greater than $2\pi$ radians; and
   combining circuitry, coupled to said phase-frequency detection circuitry, that combines said plurality 2N of detection signals to provide
      a frequency increase control signal indicative of when said feedback signal frequency is lower than said reference signal frequency, and
      a frequency decrease control signal indicative of when said feedback signal frequency is higher than said reference signal frequency;
   wherein N is an integer greater than unity and said frequency increase control signal and said frequency decrease signal have respective substantially nonzero signal values that
      vary in respective relations to a difference between said reference and feedback signal phases when said signal phase difference is less than $2\pi$ radians, and
      repeat with patterns having phase difference intervals of $2N\pi$ radians when said signal phase difference is greater than $2\pi$ radians.

2. The apparatus of claim 1, wherein said routing circuitry comprises a plurality of flip-flop circuits.

3. An apparatus including a phase-frequency detector (PFD) having increased phase error gain during acquisition of phase lock when used in a phase-locked loop (PLL), comprising:
   routing circuitry that receives and selectively routes reference and feedback signals having respective signal frequencies and phases to provide respective pluralities of reference and feedback signals;
   phase-frequency detection circuitry, coupled to said routing circuitry, that receives and detects said pluralities of reference and feedback signals to provide a plurality of detection signals having respective substantially nonzero signal values that vary in respective relations to
      a difference between said reference and feedback signal phases when said signal phase difference is less than $2\pi$ radians, and
      a difference between said reference and feedback signal frequencies when said signal phase difference is greater than $2\pi$ radians; and
   combining circuitry, coupled to said phase-frequency detection circuitry, that combines said plurality of detection signals to provide
      a frequency increase control signal indicative of when said feedback signal frequency is lower than said reference signal frequency, and
      a frequency decrease control signal indicative of when said feedback signal frequency is higher than said reference signal frequency;
   wherein said routing circuitry comprises
      control circuitry that receives and processes said reference and feedback signals to provide reference and feedback control signals, and
      multiplexing circuitry, coupled to said control circuitry, that receives and, responsive to said reference and feedback control signals, multiplexes said reference and feedback signals to respective portions of said phase-frequency detection circuitry.

4. The apparatus of claim 3, wherein said control circuitry comprises a plurality of binary counters that receive and count said reference and feedback signals to provide reference and feedback count signals as said reference and feedback control signals, respectively.

5. The apparatus of claim 3, wherein said multiplexing circuitry comprises a plurality of signal multiplexors.

6. The apparatus of claim 3, wherein:
   said phase-frequency detection circuitry comprises a plurality of phase-frequency detector circuits;
   each one of said plurality of phase-frequency detector circuits provides a respective pair of said plurality of detection signals; and
   each one of said respective pair of said plurality of detection signals has a substantially nonzero signal value that is substantially proportional to a difference between said reference and feedback signal phases and repeats with a pattern having phase difference intervals of $2\pi$ radians.

7. The apparatus of claim 3, wherein said combining circuitry comprises a plurality of logic-OR gate circuits.

8. An apparatus including a phase-frequency detector (PFD) having increased phase error gain during acquisition of phase lock when used in a phase-locked loop (PLL), comprising:
   input circuitry that receives reference and feedback signals having respective signal frequencies and phases and in response thereto provides a plurality of input signals with substantially mutually exclusive signal assertion states;
   output circuitry that receives a plurality of output signals and in response thereto provides first and second control signals indicative of when said feedback signal frequency is lower and higher, respectively, than said reference signal frequency; and
   a plurality N of phase-frequency detection circuits, coupled between said input and output circuitry, that processes said plurality of input signals to provide said plurality of output signals;
   wherein said first and second control signals have respective substantially nonzero signal values that
      vary in respective relations to a difference between said reference and feedback signal phases when said signal phase difference is less than $2\pi$ radians, and repeat with patterns having phase difference intervals of 2Nπ radians when said signal phase difference is greater than 2π radians where N is an integer greater than unity.

9. The apparatus of claim 8, wherein said input circuitry comprises a plurality of flip-flop circuits.

10. An apparatus including a phase-frequency detector (PFD) having increased phase error gain during acquisition of phase lock when used in a phase-locked loop (PLL), comprising:
  input circuitry that receives reference and feedback signals having respective signal frequencies and phases and in response thereto provides a plurality of input signals;
  output circuitry that receives a plurality of output signals and in response thereto provides first and second control signals indicative of when said feedback signal frequency is lower and higher, respectively, than said reference signal frequency; and
  a plurality N of phase-frequency detection circuits, coupled between said input and output circuitry, that processes said plurality of input signals to provide said plurality of output signals;
  wherein said first and second control signals have respective substantially nonzero signal values that
    vary in respective relations to a difference between said reference and feedback signal phases when said signal phase difference is less than 2π radians, and
    repeat with patterns having phase difference intervals of 2Nπ radians when said signal phase difference is greater than 2π radians;
  wherein said input circuitry comprises
    control circuitry that receives and processes said reference and feedback signals to provide reference and feedback control signals, and
    routing circuitry, coupled to said control circuitry, that receives and, responsive to said reference and feedback control signals, selectively routes said reference and feedback signals to respective portions of said plurality N of phase-frequency detection circuits.

11. The apparatus of claim 10, wherein said control circuitry comprises a plurality of binary counters that receive and count said reference and feedback signals to provide reference and feedback count signals as said reference and feedback control signals, respectively.

12. The apparatus of claim 10, wherein said multiplexing circuitry comprises a plurality of signal multiplexors.

13. The apparatus of claim 10, wherein said output circuitry comprises a plurality of logic-OR gate circuits.

14. The apparatus of claim 10, wherein:
  each one of said plurality N of phase-frequency detection circuits provides a respective pair of detection signals; and
  each one of said respective pair of detection signals has a substantially nonzero signal value that is substantially proportional to a difference between said reference and feedback signal phases and repeats with a pattern having phase difference intervals of 2π radians.

15. An apparatus including a phase-frequency detector (PFD) having increased phase error gain during acquisition of phase lock when used in a phase-locked loop (PLL), comprising:
  router means for receiving and selectively routing reference and feedback signals having respective signal frequencies and phases and providing respective pluralities of corresponding routed reference and feedback signals with substantially mutually exclusive signal assertion states;
  phase-frequency detector means for receiving and detecting said pluralities of reference and feedback signals and providing a plurality 2N of detection signals having respective substantially nonzero signal values that vary in respective relations to
    a difference between said reference and feedback signal phases when said signal phase difference is less than 2π radians, and
    a difference between said reference and feedback signal frequencies when said signal phase difference is greater than 2π radians; and
  combiner means for combining said plurality 2N of detection signals and providing
    a frequency increase control signal indicative of when said feedback signal frequency is lower than said reference signal frequency, and
    a frequency decrease control signal indicative of when said feedback signal frequency is higher than said reference signal frequency;
  wherein N is an integer greater than unity and said frequency increase control signal and said frequency decrease control signal have respective substantially nonzero signal values that
    vary in respective relations to a difference between said reference and feedback signal phases when said signal phase difference is less than 2π radians, and
    repeat with patterns having phase difference intervals of 2Nπ radians when said signal phase difference is greater than 2π radians.

16. An apparatus including a phase-frequency detector (PFD) having increased phase error gain during acquisition of phase lock when used in a phase-locked loop (PLL), comprising:
  input means for receiving reference and feedback signals having respective signal frequencies and phases and in response thereto providing a plurality 2N of input signals with substantially mutually exclusive signal assertion states;
  output means for receiving a plurality 2N of output signals and in response thereto providing first and second control signals indicative of when said feedback signal frequency is lower and higher, respectively, than said reference signal frequency; and
  phase-frequency detector means for processing said plurality 2N of input signals and providing said plurality 2N of output signals;
  wherein said first and second control signals have respective substantially nonzero signal values that
    vary in respective relations to a difference between said reference and feedback signal phases when said signal phase difference is less than 2π radians, and
    repeat with patterns having phase difference intervals of 2Nπ radians when said signal phase difference is greater than 2π radians;
  wherein N is an integer greater than unity and said first and second control signals have respective substantially nonzero signal values that
    vary in respective relations to a difference between said reference and feedback signal phases when said signal phase difference is less than 2π radians, and
    repeat with patterns having phase difference intervals of 2Nπ radians when said signal phase difference is greater than 2π radians.

17. An apparatus including a phase-frequency detector (PFD) having increased phase error gain during acquisition of phase lock when used in a phase-locked loop (PLL), comprising:

router means for receiving and selectively routing reference and feedback signals having respective signal frequencies and phases and providing respective pluralities of reference and feedback signals;

phase-frequency detector means for receiving and detecting said pluralities of reference and feedback signals and providing a plurality of detection signals having respective substantially nonzero signal values that vary in respective relations to
- a difference between said reference and feedback signal phases when said signal phase difference is less than $2\pi$ radians, and
- a difference between said reference and feedback signal frequencies when said signal phase difference is greater than $2\pi$ radians; and combiner means for combining said plurality of detection signals and providing
- a frequency increase control signal indicative of when said feedback signal frequency is lower than said reference signal frequency, and
- a frequency decrease control signal indicative of when said feedback signal frequency is higher than said reference signal frequency;

wherein said router means comprises
- controller means for receiving and processing said reference and feedback signals and providing reference and feedback control signals, and
- multiplexor means for receiving and responding to said reference and feedback control signals by multiplexing said reference and feedback signals to said phase-frequency detector means.

18. An apparatus including a phase-frequency detector (PFD) having increased phase error gain during acquisition of phase lock when used in a phase-locked loop (PLL), comprising:

input means for receiving reference and feedback signals having respective signal frequencies and phases and in response thereto providing a plurality 2N of input signals;

output means for receiving a plurality 2N of output signals and in response thereto providing first and second control signals indicative of when said feedback signal frequency is lower and higher, respectively, than said reference signal frequency; and phase-frequency detector means for processing said plurality 2N of input signals and providing said plurality 2N of output signals;

wherein said first and second control signals have respective substantially nonzero signal values that
- vary in respective relations to a difference between said reference and feedback signal phases when said signal phase difference is less than $2\pi$ radians, and
- repeat with patterns having phase difference intervals of $2N\pi$ radians when said signal phase difference is greater than $2\pi$ radians;

wherein said input means comprises
- controller means for receiving and processing said reference and feedback signals and providing reference and feedback control signals, and
- router means for receiving and responding to said reference and feedback control signals by selectively routing said reference and feedback signals as said plurality 2N of input signals.

* * * * *